United States Patent
Molina et al.

(10) Patent No.: US 12,063,050 B2
(45) Date of Patent: Aug. 13, 2024

(54) ANALOG-TO-DIGITAL CONVERTER AND METHOD FOR CALIBRATING THE SAME, METHOD FOR CALIBRATING A PIPELINED ANALOG-TO-DIGITAL CONVERTER, RECEIVER, BASE STATION AND MOBILE DEVICE

(71) Applicant: Intel Corporation, Santa Clara, CA (US)

(72) Inventors: Albert Molina, Novelda (ES); Kameran Azadet, San Ramon, CA (US); Martin Clara, Santa Clara, CA (US); Matteo Camponeschi, Villach (AT); Christian Lindholm, Villach (AT)

(73) Assignee: Intel Corporation, Santa Clara, CA (US)

( * ) Notice: Subject to any disclaimer, the term of this patent is extended or adjusted under 35 U.S.C. 154(b) by 115 days.

(21) Appl. No.: 17/754,309

(22) PCT Filed: Dec. 27, 2019

(86) PCT No.: PCT/US2019/068647
§ 371 (c)(1),
(2) Date: Mar. 30, 2022

(87) PCT Pub. No.: WO2021/133403
PCT Pub. Date: Jul. 1, 2021

(65) Prior Publication Data
US 2022/0345146 A1    Oct. 27, 2022

(51) Int. Cl.
*H03M 1/10* (2006.01)
*H03M 1/46* (2006.01)

(52) U.S. Cl.
CPC .................................. *H03M 1/466* (2013.01)

(58) Field of Classification Search
CPC .............................. H03M 1/466; H03M 1/10
(Continued)

(56) References Cited

U.S. PATENT DOCUMENTS

| 6,407,685 B1 * | 6/2002 | Handel | ............... | H03M 1/1038 341/120 |
| 2005/0146456 A1 | 7/2005 | Kondo | | |

(Continued)

FOREIGN PATENT DOCUMENTS

| EP | 3070849 A1 | 9/2016 |
| WO | 2019170862 A2 | 9/2019 |

*Primary Examiner* — Peguy Jean Pierre
(74) *Attorney, Agent, or Firm* — 2SPL Patent Attorneys PartG mbB; Yong Beom Hwang

(57) ABSTRACT

An analog-to-digital converter comprising a plurality of sampling cells. At least one of the plurality of sampling cells comprises a capacitive element coupled to a cell output of the at least one of the plurality of sampling cells, wherein a cell output signal is provided at the cell output. The at least one of the plurality of sampling cells further comprises a first cell input for receiving an input signal to be digitized, and a second cell input for receiving a calibration signal. Additionally, the at least one of the plurality of sampling cells comprises a first switch circuit capable of selectively coupling the first cell input to the capacitive element based on a clock signal, and a second switch circuit capable of selectively coupling the second cell input to the capacitive element, wherein a size of the second switch circuit is smaller than a size of the first switch circuit.

15 Claims, 8 Drawing Sheets

(58) Field of Classification Search
USPC .................................................. 341/155, 120
See application file for complete search history.

(56) References Cited

U.S. PATENT DOCUMENTS

| | | |
|---|---|---|
| 2010/0079319 A1 | 4/2010 | Berens et al. |
| 2011/0037628 A1* | 2/2011 | Petrovic .............. H03M 1/1038 |
| | | 341/120 |
| 2012/0268300 A1 | 10/2012 | Etou et al. |
| 2013/0162454 A1 | 6/2013 | Lin |

* cited by examiner

ANALOG-TO-DIGITAL CONVERTER AND METHOD FOR CALIBRATING THE SAME, METHOD FOR CALIBRATING A PIPELINED ANALOG-TO-DIGITAL CONVERTER, RECEIVER, BASE STATION AND MOBILE DEVICE

FIELD

The present disclosure relates to analog-to-digital conversion. In particular, examples relate to an Analog-to-Digital Converter (ADC) and a method for calibrating the same. Further examples relate to a method for calibrating a pipelined ADC. Other examples relate to a receiver, a base station and a mobile device.

BACKGROUND

The digital correction of analog impairments is helpful in reducing the overall ADC power consumption for a given performance target. In order to characterize the analog impairments and to estimate the digital correction parameters, a calibration signal may be injected into the ADC.

Hence, there may be a desired for an improved ADC architecture enabling calibration.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a", "an" and "the" is used and using only a single element is neither explicitly nor implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
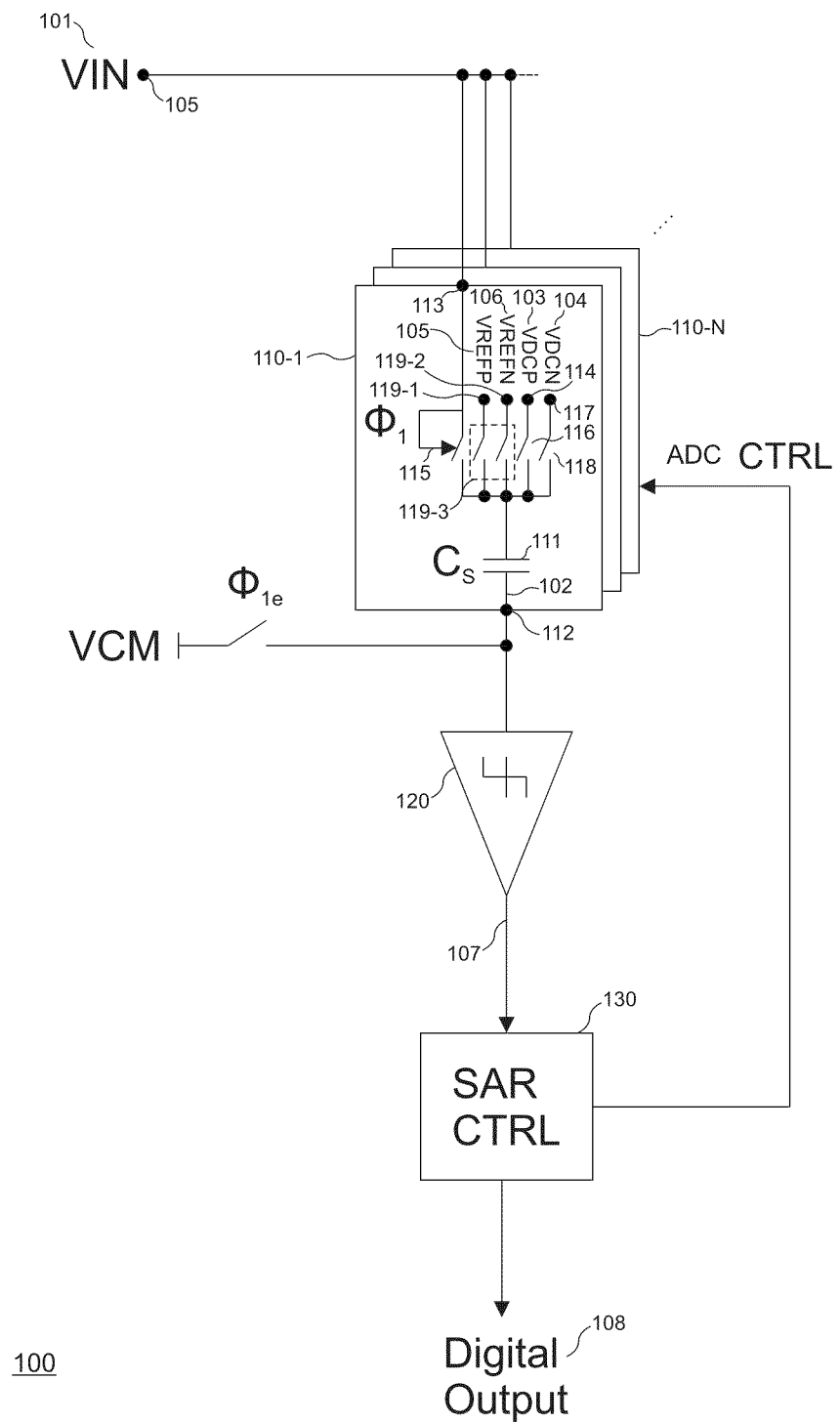
FIG. 1 illustrates a first example of an ADC.

FIG. 1 illustrates an example of an ADC 100. The ADC 100 is a Successive Approximation Register (SAR) ADC. The ADC 100 comprises a plurality of sampling cells 110-1, . . . , 110-N for sampling an input signal 101 to be digitized, i.e., an analog input signal that is to be converted to a digital signal. The plurality of sampling cells 110-1, . . . , 110-N may be any number N≥2 of sampling cells. The plurality of sampling cells 110-1, . . . , 110-N are coupled to an input (node) 105 of the ADC. The input 105 is configured to receive the input signal 101.

The structure of the plurality of sampling cells 110-1, . . . , 110-N will be described in the following with respect to the sampling cell 110-1. The other sampling cells of the plurality of sampling cells 110-1, . . . , 110-N may be identical to the sampling cell 110-1.

The sampling cell 110-1 comprises a capacitive element 111 coupled to a cell output (node) 112 of the sampling cell 110-1 for providing a cell output signal 102 of the sampling cell 110-1. Further, the sampling cell 110-1 comprises a first cell input (node) 113 for receiving the input signal 101 (i.e. a first signal), and a second cell input (node) 114 for receiving a calibration signal 103 (i.e. a second signal).

The sampling cell 110-1 additionally comprises a first switch circuit 115 capable of selectively coupling the first cell input 113 to the capacitive element 111 based on a clock signal $\Phi_1$ in order to sample the input signal 101. The first switch circuit 115 may, hence, be understood as a sampling switch. In addition, the sampling cell 110-1 comprises a second switch circuit 116 capable of selectively coupling the second cell input 114 to the capacitive element 111. For example, the first switch circuit 115 and the second switch circuit 116 may be implemented as semiconductor switches (e.g. comprising one or more transistors) A size of the second switch circuit 116 is smaller than a size of the first switch circuit 115. In other words, the dimensions of the second switch circuit 116 are smaller than the dimensions of the first switch circuit 115. For example, the size of the second switch circuit 116 may be at maximum 50%, 25%, 10%, 5%, 1% or less of the size of the first switch circuit 115.

In the sampling cell 110-1 of the ADC 100, a small switch is added in parallel to the sampling switch of the sampling cell 110-1 enabling input (injection) of the calibration signal during calibration operation of the ADC 100. Since the small second switch circuit 116 introduces only a small parasitic capacitance into the main signal path comprising the first switch circuit 115 (i.e. the sampling switch), there is no increase in power consumption and no introduction of non-linearities in the main signal path during non-calibration operation of the ADC 100 (i.e. during regular conversion operation of the ADC).

In the example of FIG. 1, the sampling cell 110-1 additionally comprises a third cell input (node) 117 for receiving another calibration signal 104 (i.e. a third signal). The other calibration signal 104 exhibits opposite polarity compared to the calibration signal 103. For example, the calibration signal 103 and/or the other calibration signal 104 may be DC signals or signals exhibiting an increasing or decreasing signal level (e.g. slow ramp signals or slow sinusoidal signals). Further, the sampling cell 110-1 comprises a third switch circuit 118 capable of selectively coupling the third cell input 117 to the capacitive element 111. A size of the third switch circuit 118 is smaller than the size of the first switch circuit 115. For example, the size of the third switch circuit 118 may be at maximum 50%, 25%, 10%, 5%, 1% or less of the size of the first switch circuit 115. In some examples, the size of the second switch circuit 116 may be (substantially) equal to the size of the third switch circuit 118. In other words, the dimensions of the second switch circuit 116 and the third switch circuit 118 may be the same (identical). The third switch circuit 118 may, e.g., be implemented as semiconductor switch (e.g. comprising one or more transistors).

The second switch circuit 116 and the third switch circuit 118 may enable injection of calibration signals of different polarity. However, it is to be noted that the third switch circuit 118 is optional. That is, the third switch circuit 118 may be omitted in some examples. For example, if the ADC 100 is to be calibrated using different polarity, the polarity of the calibration signal 103 may as well be reversed (e.g. at the calibration signal source) in order to provide calibration signals of opposite polarity for ADC calibration.

The sampling cell 110-1 further comprises a fourth cell input (node) 119-1 for receiving a reference signal 105 (i.e. a fourth signal), and a fifth cell input (node) 119-2 for receiving another reference signal 106 (i.e. a fifth signal). The other reference signal 106 exhibits opposite polarity compared to the reference signal 105. A fourth switch circuit 119-3 of the sampling cell 110-1 is capable of selectively coupling one of the fourth cell input 119-1 and the fifth cell input 119-2 to the capacitive element 111.

The ADC 100 further comprises a comparator 120 coupled to the (cell outputs of the) plurality of sampling cells 110-1, . . . , 110-N. The comparator 120 is configured to output a comparison signal 107 based on the cell output signal 102 of the sampling cell 110-1 and (optionally) the cell output signals of the other samplings cell of the plurality of sampling cells 110-1, . . . , 110-N. The comparator circuit 120 is configured to compare a comparison reference signal to the combined cell output signals of the plurality of sampling cells 110-1, . . . , 110-N, and to generate the comparison signal 107 based on the comparison of the comparison reference signal to the combined cell output signals of the sampling cells of the pluralities of sampling cells 110-1, . . . , 110-N. As indicated in FIG. 1, the ADC 100 may in some examples comprise more than one comparator 120 coupled to the plurality of sampling cells 110-1, . . . , 110-N.

Accordingly, more than one (i.e. a plurality) of comparison signal may be generated by the plurality of comparator circuits. For example, a respective comparison circuit may be provided for each of the n-bit of the ADC 100 (assuming that the ADC 100 has a resolution of n-bit).

By selectively coupling one of the fourth cell input 119-1 and the fifth cell input 119-2 to the capacitive element 111 of the sampling circuit 110-1 (and accordingly in the other sampling circuits), the decision threshold for the at least one comparator circuit 120 may be adjusted.

The ADC 100 additionally comprises a logic circuit 130 configured to generate a digital output signal 108 based on the at least one comparison signal 107.

Additionally, the logic circuit 130 is configured to control the switch circuits 115, 116, 117 and 119-3 by supplying one or more respective control signals 109 to the respective switch circuit. For example, the logic circuit 130 may configured to control the respective third switch circuit of the of the pluralities of sampling cells 110-1, . . . , 110-N during conversion of the input signal 101 based on the decision(s) of the at least one comparator 120 for the single bits of the ADC.

Since the ADC 100 is a SAR ADC, the logic circuit 130 implements a SAR logic.

Figure 2:
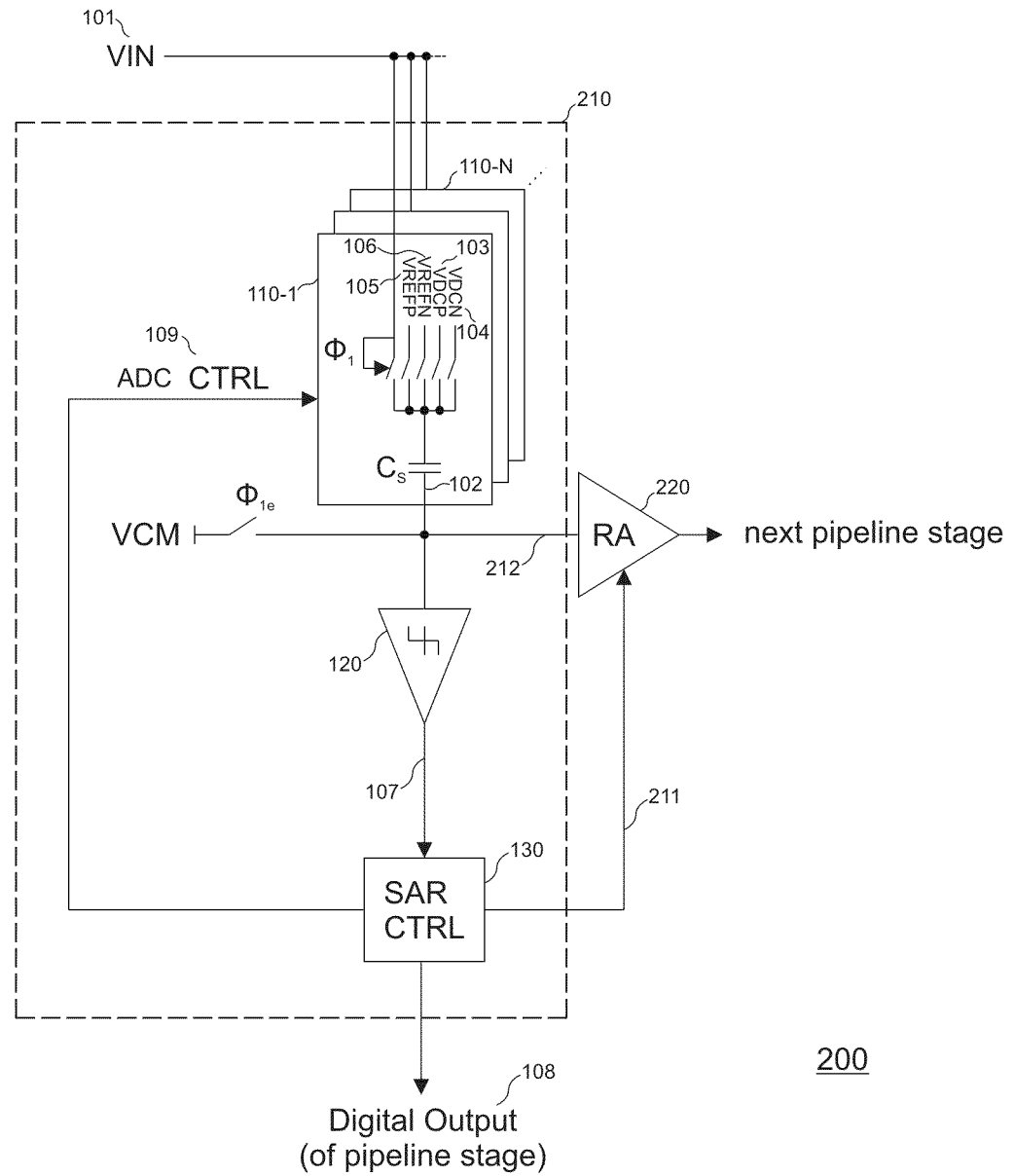
FIG. 2 illustrates a second example of an ADC.

FIG. 2 illustrates another ADC 200 using the above described sampling cell structure. The ADC 200 is a pipelined (pipeline) ADC and comprises a plurality (i.e. two or more) ADC stages coupled in series. FIG. 2 exemplarily illustrates a first ADC stage 210 of the ADC 200. The first ADC stage 210 comprises a plurality of sampling cells 110-1, . . . , 110-N as described above. Further, the first ADC stage 210 comprises at least one comparator 120 and a logic circuit 130 as described above.

The digital output signal 108 of the logic circuit 130 is the digital output of the first ADC stage 210 and may be combined by combiner circuit of the ADC 200 (not illustrated) with the digital outputs of the other ADC stages (and optionally error corrected) in order generate a digital output signal of the ADC 200.

The first ADC stage 210 is coupled to the next ADC stage of the ADC 200 (not illustrated) via a residue amplifier 220. The residue amplifier 220 is configured to receive the residue signal 212 of the first ADC stage 220 and to amplify the residue signal 212. As indicated, the residue amplifier 220 may be controlled by the logic circuit 130 of the first ADC stage 210 by means of one or more control signals 211. For example, the logic circuit 130 may enable the residue amplifier 220 after the conversion of the input signal 101 to the digital output signal 108 at the first ADC stage 210.

The amplified residue signal is then converted by the next ADC stage of the ADC 200.

Due to the structure of the sampling cells, the calibration signals 103 and 104 may be injected to the ADC stage 210 of the ADC 200 without substantially affecting the main signal path.

Figure 3:
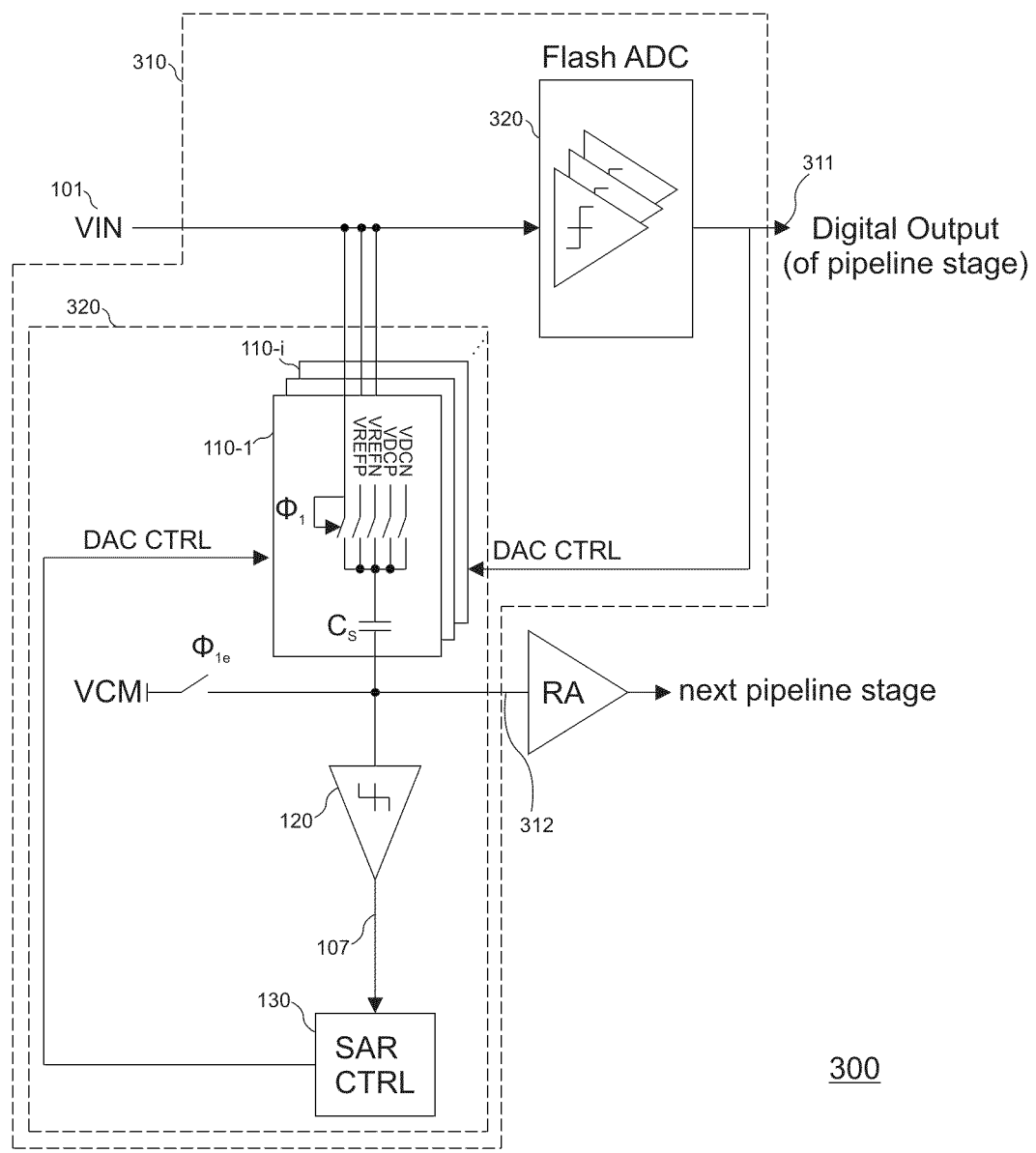
FIG. 3 illustrates a third example of an ADC.

FIG. 3 illustrates another ADC 300 using the above described sampling cell structure. The ADC 300 is a pipelined ADC and comprises a plurality (i.e. two or more) ADC stages coupled in series. FIG. 3 exemplarily illustrates a first ADC stage 310 of the ADC 300. The first ADC stage 310 comprises a flash ADC 320 and a Multiplying Digital-to-Analog Converter (MDAC) 330.

The flash ADC 320 generates a digital output signal 311 of the first ADC stage 310 based on the input signal 101. The digital output signal 311 of the first ADC stage 310 may be combined with the digital outputs of the other ADC stages (and optionally error corrected) in order generate a digital output signal of the ADC 300.

The MDAC 330 is used to generate the residue signal 312 of the first ADC stage 310. The MDAC 330 comprises a plurality of sampling cells 110-1, ..., 110-N as described above.

Further, the MDAC 330 comprises at least one comparator 120 and a logic circuit 130 as described above. The switching behavior of the switch circuits of the sampling cells 110-1, ..., 110-N is controlled by the flash ADC 320 and the logic circuit 130.

The first ADC stage 310 is coupled to the next ADC stage of the ADC 300 (not illustrated) via a residue amplifier 320. The residue amplifier 220 is configured to receive the residue signal 312 of the first ADC stage 320 and to amplify the residue signal 312. The amplified residue signal is then converted by the next ADC stage of the ADC 300.

Figure 4:
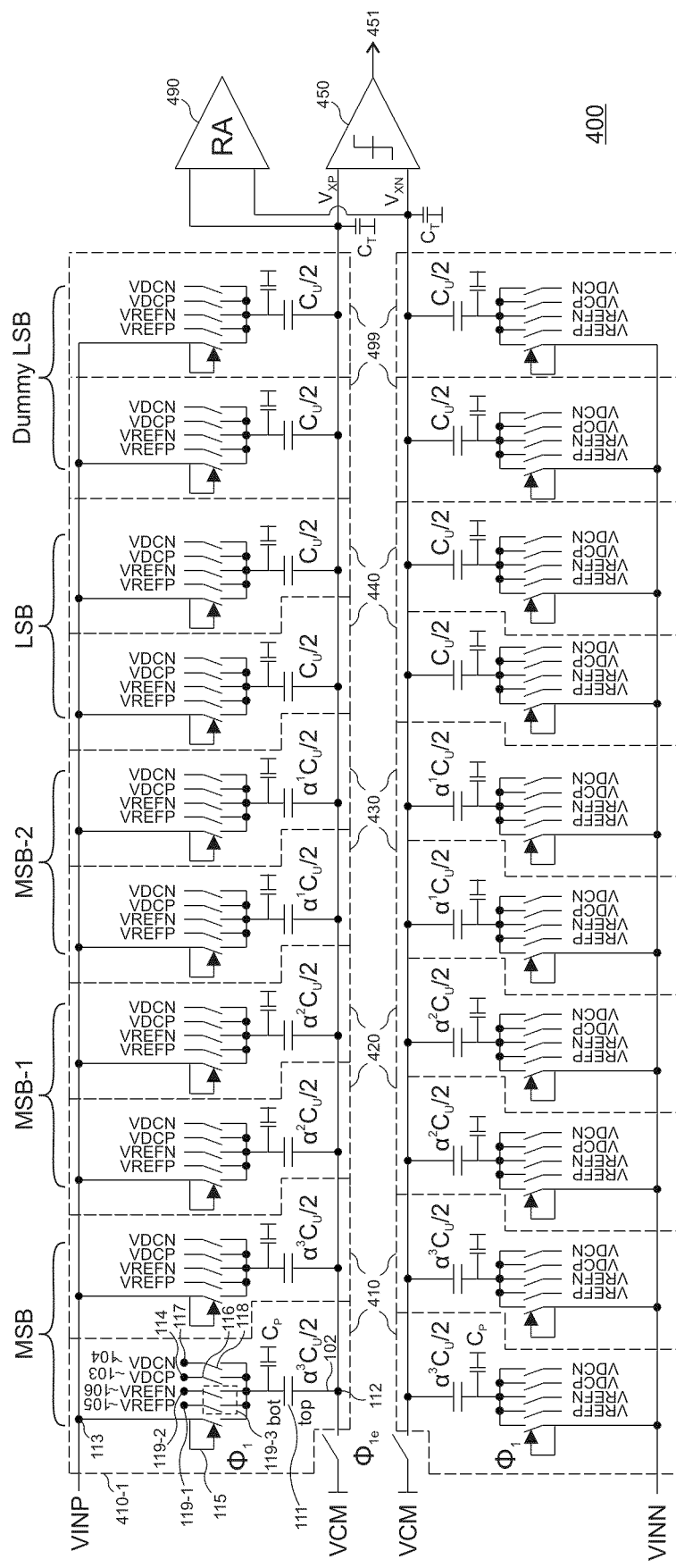
FIG. 4 illustrates a fourth example of an ADC.

FIG. 4 illustrates a further ADC 400. In contrast to the above described single-ended ADCs, the ADC 400 is a differential ADC. Although the ADC 400 is illustrated as a 4-bit ADC in FIG. 4, it is to be noted that the illustrated ADC structure may be used for any n-bit ADC structure.

The ADC 400 comprises a respective plurality of sampling cells 410, 420, 430, 440 for each bit of the n=4-bit. The ADC 400 is a split capacitor ADC. Further illustrated in FIG. 4 is a plurality of sampling cells 499 for a dummy LSB that allow dummy switching during operation of the ADC 400. The sampling cells 499 for the dummy LSB may be omitted.

The sampling cells of the pluralities of sampling cells 410, 420, 430, 440 are (substantially) of the same structure (i.e. they may be identical). The sampling cells are of the same structure as described above. This will be exemplarily described in the following for the sampling cell 410-1 of the plurality of sampling cells 410.

At the bottom plate (input side) of the capacitor 411, the first switch circuit (main sampling switch) 115 and the fourth switch circuit 119-3 connecting each capacitor to either the reference signal (voltage) 105 or the other reference signal (voltage) 106 are arranged. These switches are large in order to allow for fast operation. In addition to these switches, the second switch circuit 116 and the third switch circuit 118 are arranged in parallel for coupling the second cell input 114 (providing the calibration signal 103) or the third cell input 117 (providing the other calibration signal 104) to the capacitor 111 during calibration. Since these switches are small, it may take several clock cycles for the capacitor 111 to charge fully. This is not an issue during calibration. Once the capacitors are charged, ADC conversion can be performed in the normal way.

As indicated in FIG. 4, each capacitive element of the plurality of sampling cells 410 for the Most Significant Bit (MSB) exhibits the capacitance $\alpha^3 \cdot C_U/2$ ($C_U$ denotes a unit capacitance), each capacitive element of the plurality of sampling cells 420 for the MSB-1 exhibits the capacitance $\alpha^2 \cdot C_U/2$, each capacitive element of the plurality of sampling cells 430 for the MSB-2 exhibits the capacitance $\alpha^1 \cdot C_U/2$, and each capacitive element of the plurality of sampling cells 440 for the Least Significant Bit (LSB) exhibits the capacitance $\alpha^0 \cdot C_U/2$. In other words, each capacitive element of a respective plurality of sampling cells for a bit of the n=4-bit exhibits a bit-specific capacitance.

The capacitive elements of a respective one of the pluralities of sampling cells 410, ..., 440 for the individual bits of the n=4-bit exhibit a respective capacitance which corresponds to the significance of the respective bit. That is, the capacitance $\alpha^3 \cdot C_U/2$ of the capacitive elements of the plurality of sampling cells 110 for the MSB corresponds to the significance of the MSB, the capacitance $\alpha^2 \cdot C_U/2$ of the capacitive elements of the plurality of sampling cells 420 for the MSB1 corresponds to the significance of the MSB-1, etc.

Therefore, the capacitive elements of different ones of the pluralities of sampling cells 410, ..., 440 for the individual bits of the n=4-bit exhibit different capacitances. The capacitance $\alpha^3 \cdot C_U/2$ of the plurality of sampling cells 410 for the MSB is different from the capacitance $\alpha^2 \cdot C_U/2$ of the capacitive elements of the plurality of sampling cells 420 for the MSB-1, the capacitance $\alpha^2 \cdot C_U/2$ of the capacitive elements of the plurality of sampling cells 420 for the MSB-1 is different from the capacitance $\alpha^1 \cdot C_U/2$ of the capacitive elements of the plurality of sampling cells 430 for the MSB-2, etc.

The ADC 400 comprises at least one comparator circuit 450 coupled to (the cell outputs of) the sampling cells of the pluralities of sampling cells 410, ..., 440. Accordingly, the at least one comparator circuit 450 is configured to output a comparison signal 451 based on the cell output signals of the sampling cells of the pluralities of sampling cells 410, ..., 440. A residue amplifier 490 is coupled between the sampling cells of the pluralities of sampling cells 410, ..., 440 and the at least one comparator circuit 450 in order to amplify the cell output signals of the sampling cells.

The logic circuit of the ADC 400 is not illustrated in FIG. 4 for reasons of simplicity. However, as described above for the other ADCs, the logic circuit of the ADC 400 receives the comparison signal 451 of the at least one comparator circuit 450 and generates a digital output signal of the ADC 400 based thereon. Further, the logic circuit controls the switching circuits of the sampling cells based on the comparison signal 451 of the at least one comparator circuit 450. For example, the logic circuit of the ADC 400 may implement SAR logic.

Figure 5:
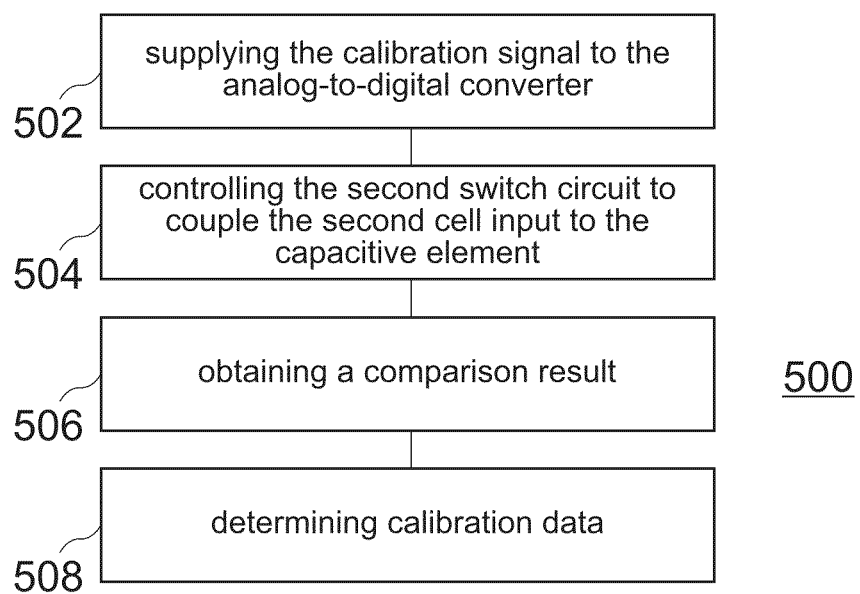
FIG. 5 illustrates a flowchart of an example of a method for calibrating an ADC.

The digital output of an ADC is an estimate of the analog input signal. Knowing the input signal and the output signal, one may estimate the impairments in the ADC. FIG. 5 illustrates a flowchart of an example of a method 500 for calibrating an ADC according to the proposed technique.

The method 500 comprises supplying 502 the calibration signal to the ADC. Further, the method 500 comprises controlling 504 the second (respective) switch circuit of one or more of the sampling cells of the ADC (e.g. all of the sampling cells) to couple the (respective) second cell input to the (respective) capacitive element such that the calibration signal is supplied to the capacitive element. The method 500 comprises obtaining 506 a comparison result by comparing a digital reference signal to a digital output signal generated by the ADC based on the at least one calibration signal provided by the at least one comparator circuit of the ADC. The digital reference signal is an ideal/target digital representation of the calibration signal. Additionally, the method 500 comprises determining 508 calibration data for the ADC based on the comparison result. By comparing the digital reference signal to the digital output signal of the ADC, the impairments in the ADC and, hence, calibration data for the ADC may be determined.

As described above, the calibration signal may be one of a DC signal or a signal exhibiting an increasing or decreasing signal level. Further, the calibration signal may be a low frequency calibration signal (e.g. a DC signal, a sinusoidal signal or a slow ramp). In other words, a frequency of the calibration signal may be lower than a frequency of the input signal to be digitized (to be converted to a digital signal).

Figure 6:
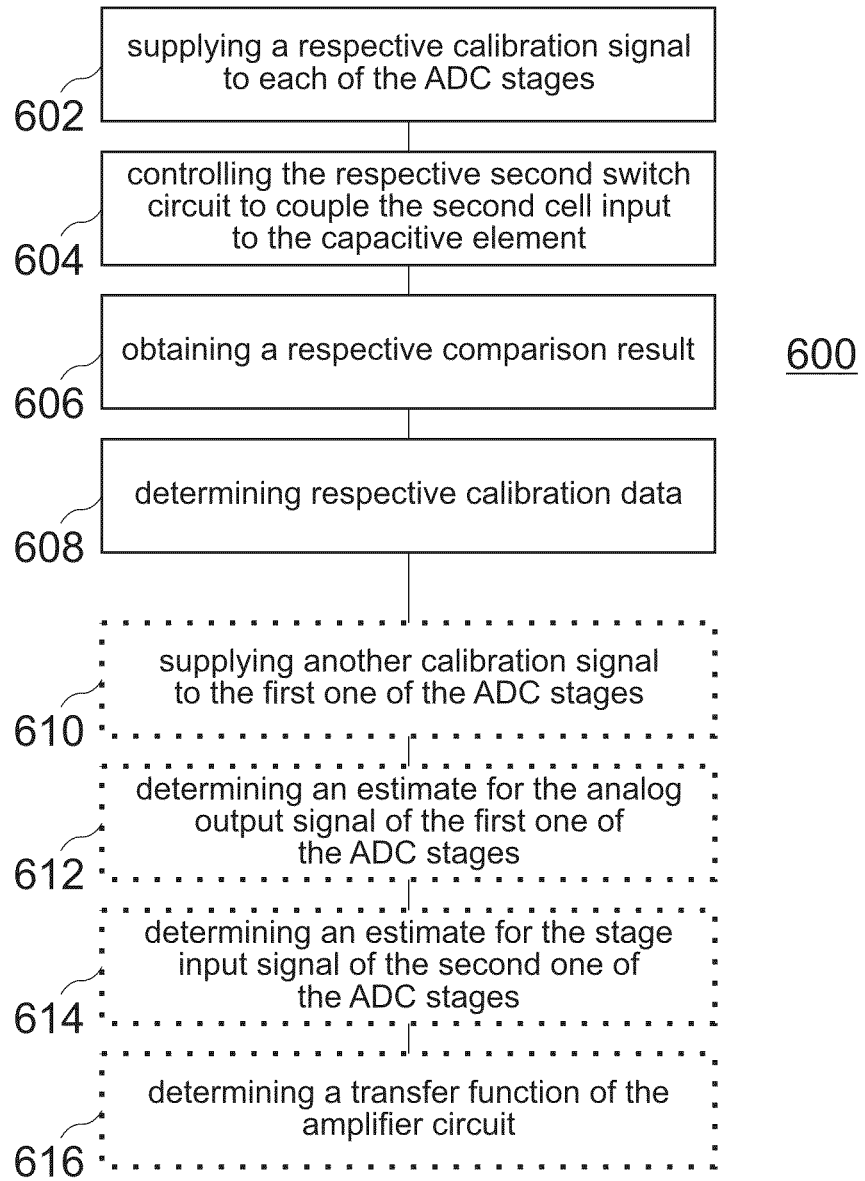
FIG. 6 illustrates a flowchart of an example of a method for calibrating a pipelined ADC.

FIG. 6 further illustrates a flowchart of an example of a method 600 for calibrating a pipelined ADC comprising a cascade of at least two ADC stages (i.e. at least two ADC stages coupled in series). The method 600 will be described in the following with reference to FIG. 7 which illustrates a pipelined ADC 700.

The pipelined ADC 700 comprises three SAR ADC stages 710, 720 and 730. Each of the ADC stages 710, 720 and 730 comprises a respective SAR ADC 711, 721 and 731 using to the proposed sampling cell architecture. Two residue amplifiers (amplifier circuits) 740 and 750 are coupled between the ADC stages 710, 720 and 730. A reconstruction circuit 760 is configured to receive and combine the digital output signals of the 710, 720 and 730 to an ADC output signal 702.

First, the individual ADCs 711, 721 and 731 are calibrated. Therefore, method 600 comprises supplying 602 a respective calibration signal as stage input signal to each of the ADC stages.

Figure 7:
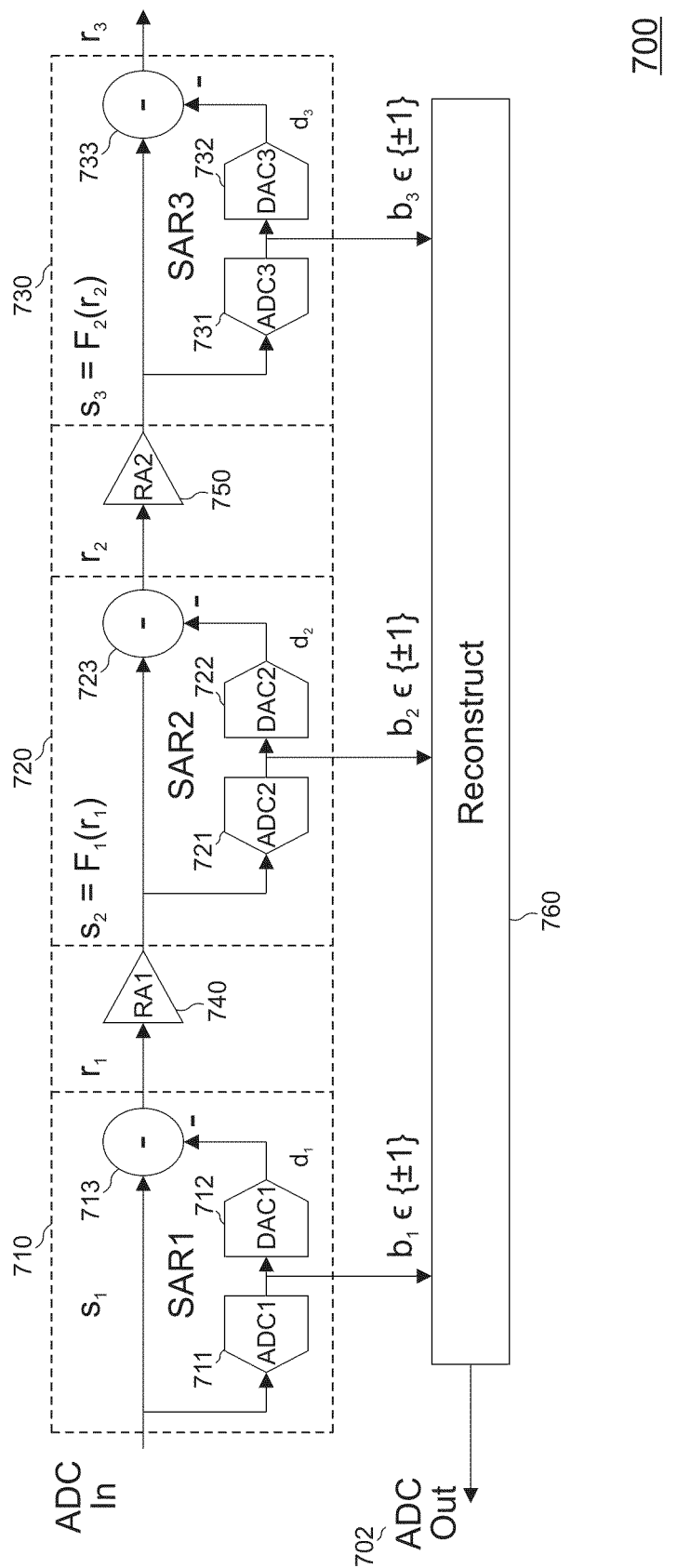
FIG. 7 illustrates an example of a pipelined ADC.

In the example of FIG. 7, a respective calibration signal $s_1$, $s_2$ and $s_3$ is supplied as stage input signal to each of the ADC stages 710, 720 and 730.

Further, method 600 comprises controlling 604 the respective second switch circuit(s) of the ADC of each of the ADC stages 710, 720 and 730 to couple the respective second cell input to the respective capacitive element. Method 600 additionally comprises obtaining a respective comparison result by comparing a respective digital reference signal to the respective digital output signal $b_1$, $b_2$ and $b_3$ which is generated by the ADC of each of the ADC stages 710, 720 and 730 based on the respective calibration signal $s_1$, $s_2$ or $s_3$. For example, the comparison result for the ADC stage 710 is determined by comparing the digital output signal $b_1$ of the ADC stage 710 with a first digital reference signal for the calibration signal $s_1$ input to the ADC stage 710.

Method 600 comprises determining 608 respective calibration data for the respective ADC of each of the ADC stages 710, 720 and 730 based on the respective comparison result.

In other words, in a pipeline SAR ADC, a signal may be injected into each SAR ADC ($s_1$, $s_2$ or $s_3$) and the impairments may be estimated by reading the comparator outputs ($b_1$, $b_2$, $b_3$) as described above. For example, the respective calibration signal may be one of a DC signal or a signal exhibiting an increasing or decreasing signal level. Further, the calibration signal may be a low frequency calibration signal (e.g. a DC signal, a sinusoidal signal or a slow ramp).

In addition to estimating the impairments of the sub-ADCs of each ADC stage, the low-frequency signal injection and measurement mechanism may further be used to characterize the residue amplifiers 740 and 750 between the ADC stages 710, 720 and 730.

Each of the ADC stages 710, 720 and 730 comprises a respective DAC 712, 722, 732 for generating a respective modification signal $d_1$, $d_2$ and $d_3$ based on the respective digital output signal $b_1$, $b_2$, $b_3$ generated by the respective ADC 711, 721, 731 of the respective ADC stage 710, 720, 730. Each of the ADC stages 710, 720 and 730 comprises a respective signal combination circuit 713, 723 and 733 configured to generate a respective analog stage output signal (residue signal) $r_1$, $r_2$, $r_3$ based on the respective modification signal $d_1$, $d_2$, $d_3$ and the respective stage input signal $s_1$, $s_2$, $s_3$.

The amplifier circuit 740 is coupled between the ADC stages 710 and 720 for amplifying the analog stage output signal $r_1$ of the ADC stage 710 prior to supplying it to the ADC stage 720 as stage input signal $s_2$ for the ADC stage 720. Similarly, the amplifier circuit 750 is coupled between the ADC stages 720 and 730 for amplifying the analog stage output signal $r_2$ of the ADC stage 720 prior to supplying it to the ADC stage 730 as stage input signal $s_3$ for the ADC stage 730.

For example, for estimating the transfer function of the residue amplifier 750, the method 600 comprises supplying 600 another calibration signal as stage input signal to the ADC stage 720, i.e. the first one of the ADC stages 720 and 730 coupled by the residue amplifier 750.

Further, method 600 comprises determining 612 an estimate for the analog stage output signal $r_2$ of the ADC stage 720 (i.e. the first one of the ADC stages 720 and 730 coupled by the residue amplifier 750) based on the digital output signal $b_2$ which is generated by the ADC 721 of the ADC stage 720 based on the other calibration signal and the previously determined calibration data for the ADC 721 of the ADC stage 720. In other words, assuming that the ADC 721 is calibrated, $d_2$ can be generated from $b_2$ and, hence, $r_2$ (i.e. the input to the residue amplifier 750) can be estimated.

Additionally, method 600 comprises determining 614 an estimate for the stage input signal $s_3$ of the ADC stage 730 (i.e. second one of the ADC stages 720 and 730 coupled by the residue amplifier 750) based on the digital output signal $b_3$ which is generated by the ADC 731 of the ADC stage 730 and the calibration data for the ADC 731 of the ADC stage 730. In other words, $s_3$ may be estimated from the knowledge of $b_3$ (e.g. assuming that the final residue $r_3$ is small).

Method 600 in addition comprises determining 616 a transfer function of the amplifier circuit 750 based on the estimate for the analog stage output signal $r_2$ of the ADC stage 720 (i.e. the first one of the ADC stages 720 and 730 coupled by the residue amplifier 750) and the estimate for the stage input signal $s_3$ of the ADC stage 730 (i.e. second one of the ADC stages 720 and 730 coupled by the residue amplifier 750). In other words, knowing $r_2$ and $s_3$, the transfer function of the amplifier circuit 750 may be estimated.

The transfer function of the amplifier circuit 740 may be estimated similarly (analogously).

Figure 8:
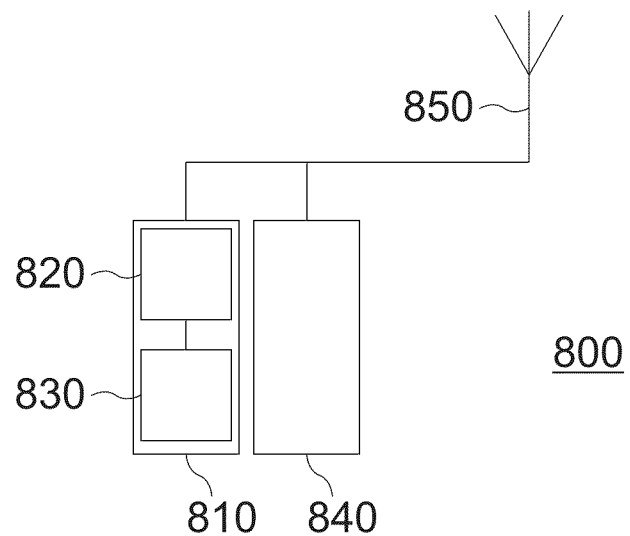
FIG. 8 illustrates an example of a base station.

An example of an implementation using an ADC according to one or more aspects of the architecture described above in connection with FIGS. 1 to 7 or one or more examples described above in connection with FIGS. 1 to 7 is illustrated in FIG. 8. FIG. 8 schematically illustrates an example of a radio base station 800 (e.g. for a femtocell, a picocell, a microcell or a macrocell) comprising an ADC 820 as proposed.

The ADC 820 is part of a receiver 810. The receiver 810 additionally comprises a signal generation circuit 830 coupled to the ADC 820. The signal generation circuit 830 is configured to generate the calibration signal (e.g. a DC signal or a signal exhibiting an increasing or decreasing signal level over time) for calibrating the ADC 820.

The receiver 810 is coupled to an antenna element 850 of the base station 800 (either directly or indirectly via one or more intermediate elements such as a filter or a Low Noise Amplifier, LNA). The ADC 820 is coupled to the antenna element 850 for converting a radio frequency receive signal received by the antenna element 850 to a digital signal.

Further, the base station 800 comprises a transmitter 840 configured to generate a radio frequency transmit signal. The transmitter 840 may use the antenna element 850 or another antenna element (not illustrated) of the base station 800 for radiating the radio frequency transmit signal to the environment.

To this end, a base station with an ADC enabling improved calibration may be provided.

The base station 800 may comprise further elements such as, e.g., a baseband processor, an application processor, memory, a network controller, a user interface, power management circuitry, a satellite navigation receiver, a network interface controller or power tee circuitry.

In some aspects, the application processor may include one or more Central Processing Unit CPU cores and one or more of cache memory, a Low-DropOut (LDO) voltage regulator, interrupt controllers, serial interfaces such as Serial Peripheral Interface (SPI), Inter-Integrated Circuit ($I^2C$) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 9:
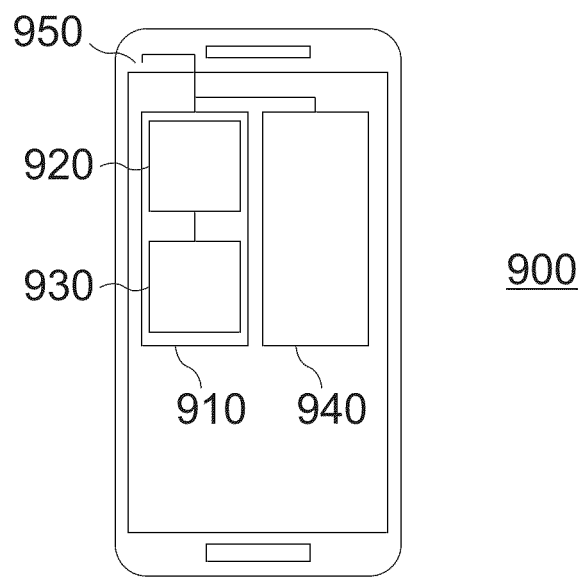
FIG. 9 illustrates an example of a mobile device.

Another example of an implementation using an ADC according to one or more aspects of the architecture described above in connection with FIGS. 1 to 7 or one or more examples described above in connection with FIGS. 1 to 7 is illustrated in FIG. 9. FIG. 9 schematically illustrates an example of a mobile device 900 (e.g. mobile phone, smartphone, tablet-computer, or laptop) comprising an ADC 920 as proposed.

The ADC 920 is part of a receiver 910. The receiver 910 additionally comprises a signal generation circuit 930 coupled to the ADC 920. The signal generation circuit 930 is configured to generate the calibration signal (e.g. a DC signal or a signal exhibiting an increasing or decreasing signal level over time) for calibrating the ADC 920.

The receiver 910 is coupled to an antenna element 950 of the mobile device 900 (either directly or indirectly via one or more intermediate elements such as a filter or an LNA). The ADC 920 is coupled to the antenna element 950 for converting a radio frequency receive signal received by the antenna element 950 to a digital signal.

Further, the mobile device 900 comprises a transmitter 940 configured to generate a radio frequency transmit signal. The transmitter 940 may use the antenna element 950 or another antenna element (not illustrated) of the mobile device 900 for radiating the radio frequency transmit signal to the environment.

To this end, a mobile device with an ADC enabling improved calibration may be provided.

The mobile device 900 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, $I^2C$ or universal programmable serial interface module, RTC, timer-counters including interval and watchdog timers, general purpose input-output (IO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using an ADC according to the proposed architecture or one or more of the examples described above may be configured to operate according to one of the 3GPP-standardized mobile communication networks or systems. The mobile or wireless communication system may correspond to, for example, a 5G NR, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

The proposed architecture may enable ADC Calibration using a low frequency signal source and slow sampling. A low frequency calibration signal (e.g. DC or slow ramp) may be injected via the small switches into the ADC and the comparator outputs may be observed and compared against the expected output in order to calibrate the ADC. In the case of a pipeline ADC, it may be advantageous to add the same mechanism to all the pipeline stages.

The examples described herein may be summarized as follows:

Example 1 is an ADC comprising a plurality of sampling cells, wherein at least one of the plurality of sampling cells comprises: a capacitive element coupled to a cell output of the at least one of the plurality of sampling cells, wherein a cell output signal is provided at the cell output; a first cell input for receiving an input signal to be digitized; a second cell input for receiving a calibration signal; a first switch circuit capable of selectively coupling the first cell input to the capacitive element based on a clock signal; and a second switch circuit capable of selectively coupling the second cell input to the capacitive element, wherein a size of the second switch circuit is smaller than a size of the first switch circuit.

Example 2 is the ADC of example 1, wherein the at least one of the plurality of sampling cells further comprises: a third cell input for receiving another calibration signal, wherein the other calibration signal exhibits opposite polarity compared to the calibration signal; and a third switch circuit capable of selectively coupling the third cell input to the capacitive element, wherein a size of the third switch circuit is smaller than the size of the first switch circuit.

Example 3 is the ADC of example 2, wherein the size of the second switch circuit is equal to the size of the third switch circuit.

Example 4 is the ADC of any of examples 1 to 3, wherein the at least one of the plurality of sampling cells further comprises: a fourth cell input for receiving a reference signal; a fifth cell input for receiving another reference signal, wherein the other reference signal exhibits opposite polarity compared to the reference signal; and a fourth switch circuit capable of selectively coupling one of the fourth cell input and the fifth cell input to the capacitive element.

Example 5 is the ADC of any of examples 1 to 4, wherein the size of the second switch circuit is at maximum 50% of the size of the first switch circuit.

Example 6 is the ADC of any of examples 1 to 5, wherein the size of the second switch circuit is less than 10% of the size of the first switch circuit.

Example 7 is the ADC of any of examples 1 to 6, further comprising: at least one comparator coupled to the plurality of sampling cells, wherein the at least one comparator is configured to output a comparison signal based on the cell output signal of the at least one of the plurality of sampling cells.

Example 8 is the ADC of example 7, further comprising: a logic circuit configured to generate a digital output signal based on the comparison signal.

Example 9 is a method for calibrating the ADC according to any of examples 1 to 8, the method comprises: supplying the calibration signal to the ADC; controlling the second switch circuit to couple the second cell input to the capacitive element; obtaining a comparison result by comparing a digital reference signal to a digital output signal generated by the ADC based on the calibration signal; and determining calibration data for the ADC based on the comparison result.

Example 10 is the method of example 9, wherein the calibration signal is one of a DC signal or a signal exhibiting an increasing or decreasing signal level.

Example 11 is the method of example 9 or example 10, wherein a frequency of the calibration signal is lower than a frequency of the input signal.

Example 12 is a method for calibrating a pipelined ADC comprising a cascade of at least two ADC stages, wherein each ADC stage comprises a respective ADC according to any of examples 1 to 8, the method comprising: supplying a respective calibration signal as stage input signal to each of the ADC stages; controlling the respective second switch circuit of the ADC of each of the ADC stages to couple the respective second cell input to the respective capacitive element; obtaining a respective comparison result by comparing a respective digital reference signal to the respective digital output signal which is generated by the ADC of each of the ADC stages based on the respective calibration signal; and determining respective calibration data for the respective ADC of each of the ADC stages based on the respective comparison result.

Example 13 is the method of example 12, wherein each of the ADC stages comprises a digital-to-analog converter for generating a respective modification signal based on the respective digital output signal generated by the ADC of the ADC stage, wherein each of the ADC stages comprises a respective signal combination circuit configured to generate a respective analog stage output signal based on the respective modification signal and the respective stage input signal, and wherein an amplifier circuit is coupled between the ADC stages for amplifying the analog stage output signal of the first one of the ADC stages prior to supplying it to the second one of the ADC stages as stage input signal for the second one of the ADC stages, and wherein the method further comprises: supplying another calibration signal as stage input signal to the first one of the ADC stages; determining an estimate for the analog stage output signal of the first one of the ADC stages based on the digital output signal which is generated by the ADC of the first one of the ADC stages based on the other calibration signal and the calibration data for the ADC of the first one of the ADC stages; determining an estimate for the stage input signal of the second one of the ADC stages based on the digital output signal which is generated by the ADC of the second one of the ADC stages and the calibration data for the ADC of the second one of the ADC stages; and determining a transfer function of the amplifier circuit based on the estimate for the analog stage output signal of the first one of the ADC stages and the estimate for the stage input signal of the second one of the ADC stages.

Example 14 is a receiver, comprising: an ADC according to any of examples 1 to 8; and a signal generation circuit configured to generate the calibration signal.

Example 15 is the receiver of example 14, wherein the calibration signal exhibits an increasing or decreasing signal level.

Example 16 is a base station, comprising: a receiver according to example 14 or example 15; and at least one antenna element coupled to the receiver.

Example 17 is the base station of example 16, further comprising a transmitter configured to supply a radio frequency transmit signal to the antenna element for radiation to the environment.

Example 18 is a mobile device, comprising: a receiver according to example 14 or example 15; and at least one antenna element coupled to the receiver.

Example 19 is the mobile device of example 18, further comprising a transmitter configured to supply a radio frequency transmit signal to the antenna element for radiation to the environment.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons.

Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An analog-to-digital converter comprising a plurality of sampling cells, wherein at least one of the plurality of sampling cells comprises:
    a capacitive element coupled to a cell output of the at least one of the plurality of sampling cells, wherein a cell output signal is provided at the cell output;
    a first cell input for receiving an input signal to be digitized;
    a second cell input for receiving a calibration signal;
    a first switch circuit capable of selectively coupling the first cell input to the capacitive element based on a clock signal; and
    a second switch circuit capable of selectively coupling the second cell input to the capacitive element, wherein a size of the second switch circuit is smaller than a size of the first switch circuit.

2. The analog-to-digital converter of claim 1, wherein the at least one of the plurality of sampling cells further comprises:
    a third cell input for receiving another calibration signal, wherein the other calibration signal exhibits opposite polarity compared to the calibration signal; and a third switch circuit capable of selectively coupling the third cell input to the capacitive element, wherein a size of the third switch circuit is smaller than the size of the first switch circuit.

3. The analog-to-digital converter of claim 2, wherein the size of the second switch circuit is equal to the size of the third switch circuit.

4. The analog-to-digital converter of claim 1, wherein the at least one of the plurality of sampling cells further comprises:
   a third cell input for receiving a first reference signal;
   a fourth cell input for receiving a second reference signal, wherein the second reference signal exhibits opposite polarity compared to the first reference signal; and
   a third switch circuit capable of selectively coupling one of the third cell input and the fourth cell input to the capacitive element.

5. The analog-to-digital converter of claim 1, wherein the size of the second switch circuit is at maximum 50% of the size of the first switch circuit.

6. The analog-to-digital converter of claim 1, wherein the size of the second switch circuit is less than 10% of the size of the first switch circuit.

7. The analog-to-digital converter of claim 1, further comprising:
   at least one comparator coupled to the plurality of sampling cells, wherein the at least one comparator is configured to output a comparison signal based on the cell output signal of the at least one of the plurality of sampling cells.

8. The analog-to-digital converter of claim 7, further comprising:
   a logic circuit configured to generate a digital output signal based on the comparison signal.

9. A method for calibrating the analog-to-digital converter according to claim 1, the method comprises:
   supplying the calibration signal to the analog-to-digital converter;
   controlling the second switch circuit to couple the second cell input to the capacitive element;
   obtaining a comparison result by comparing a digital reference signal to a digital output signal generated by the analog-to-digital converter based on the calibration signal; and
   determining calibration data for the analog-to-digital converter based on the comparison result.

10. The method of claim 9, wherein the calibration signal is one of a DC signal or a signal exhibiting an increasing or decreasing signal level.

11. The method of claim 9, wherein a frequency of the calibration signal is lower than a frequency of the input signal.

12. A receiver, comprising:
   an analog-to-digital converter according to claim 1; and
   a signal generation circuit configured to generate the calibration signal.

13. The receiver of claim 12, wherein the calibration signal exhibits an increasing or decreasing signal level.

14. A base station, comprising:
   a receiver according to claim 12; and
   at least one antenna element coupled to the receiver.

15. The base station of claim 14, further comprising a transmitter configured to supply a radio frequency transmit signal to the antenna element for radiation to the environment.

* * * * *